(12) United States Patent
Ishikawa et al.

(10) Patent No.: US 6,178,131 B1
(45) Date of Patent: Jan. 23, 2001

(54) MAGNETIC RANDOM ACCESS MEMORY

(75) Inventors: Akira Ishikawa, Royse City, TX (US); Atsuyuki Fukano, Tokyo (JP); Shunsuke Yasutaka, deceased, late of Tsuchiura (JP), by Sachiko Yasutaka, heir; by Seigo Yasutaka, heir, Sapporo (JP); by Mieko Karube, heir, Abiko (JP)

(73) Assignee: Ball Semiconductor, Inc., Allen, TX (US)

( * ) Notice: Under 35 U.S.C. 154(b), the term of this patent shall be extended for 0 days.

(21) Appl. No.: 09/479,725

(22) Filed: Jan. 7, 2000

Related U.S. Application Data

(60) Provisional application No. 60/115,509, filed on Jan. 11, 1999.

(51) Int. Cl.[7] .................................................... G11C 7/00
(52) U.S. Cl. ...................... 365/225.7; 365/157; 365/158
(58) Field of Search ........................................ 365/157, 158, 365/225.5, 145, 117

(56) References Cited

U.S. PATENT DOCUMENTS 5,673,220 * 9/1997 Gendlin ................................ 365/157
5,946,227 * 8/1999 Nagi ..................................... 365/158

OTHER PUBLICATIONS

Tehrani, S., et al., "High Density Nonvolatile Magnetoresistive RAM", IEEE, IEDM 96–193, 1996, pp. 7.7.1–7.7.4.

Lyu, Jong–Son, et al., "Metal–Ferroelectric–Semiconductor Field–Effect Transistor (MFSFET) for Single Transistor Memory by Using Poly–Si Source/Drain and BaMgF$_4$ Dielectric", IEEE, IEDM 96–503, 1996, pp. 19.3.1–19.3.4.

* cited by examiner

*Primary Examiner*—Vu A. Le
(74) *Attorney, Agent, or Firm*—Haynes & Boone, LLP

(57) ABSTRACT

The present invention discloses a magnetic random access memory (MRAM). It improves upon conventional RAM designs by memorizing a logic bit value through magnetizing ferromagnetic material layer near the intersection of a specific word line and bit line. A write operation and an erase operation can be performed by changing direction of current flow on the bit line and word line. A read operation can be performed by monitoring an output current signal from an input current signal. A multiple layer design can be done on a silicon substrate to implement the MRAM by appropriately arranging the layers for the bit line, the word line, and the ferromagnetic material layer.

23 Claims, 4 Drawing Sheets

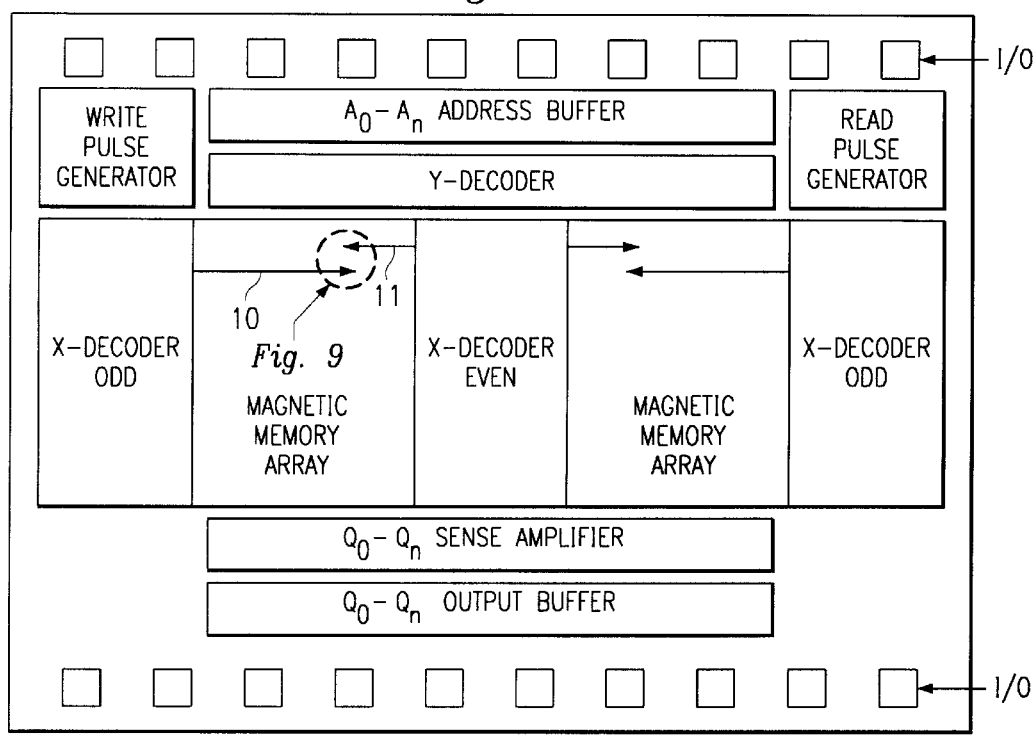
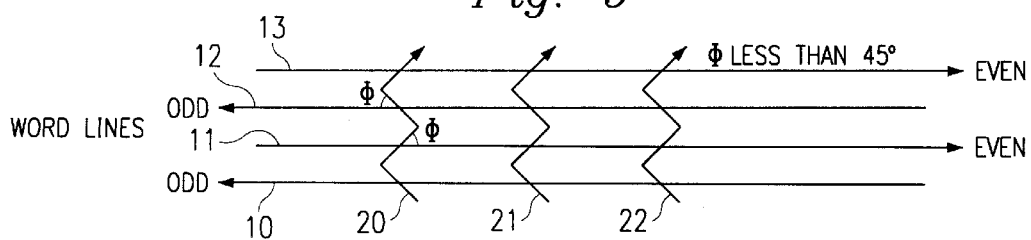

MAGNETIC RANDOM ACCESS MEMORY

CROSS REFERENCE

This application claims the benefit of U.S. Provisional Application Ser. No. 60/115,509, which was filed on Jan. 11, 1999.

BACKGROUND OF THE INVENTION

The invention relates generally to integrated circuits, and more particularly, to a magnetic random access memory for use in a semiconductor integrated circuit.

Conventional non-volatile random access memory ("RAM"), such as those used on a flat-shaped or spherical-shaped semiconductor integrated circuits, is a comparatively expensive circuit to produce. For one, it typically takes from 15 to 30 mask levels to implement the complicated memory cell structure. Also, many ion implantation processes and vacuum processes are necessary, thereby requiring a very long process time. Further, memory cells (especially dynamic memory cells) tend to leak and therefore require maintenance or refreshing circuitry. Further still, memory density (e.g., the number of memory cells per unit area) is always desired to be as large as possible to reduce the size requirements and/or increase the number of memory cells in the integrated circuit.

Some attempts have been made at alternate types of high density RAM. For example, in Tehrani, S., Chen, E., Durlam, M., Zhu, T., and Goronkin, H. (1996), "High Density Nonvolatile Magnetoresistive RAM," IEDM, IEDM 96-193 to 194, a non-volatile memory cell based on Ferro-magnetically coupled giant magneto-resistive material is disclosed. In Lyu, J S., Kim, B W., Kim, K H., Cha, J Y., Yoo, H J (1996), "Metal-Ferroelectric-Semiconductor Field-Effect Transistor (MFSFET) for Single Transistor Memory by Using Poly-Si Source/Drain and BaMgF$_4$ Dielectric," IEDM, IEDM 96-503 to 506, a MFSFET with polysilicon islands as source/drain electrodes and BaMgF$_4$ film as a gate dielectric is disclosed. However, both of these alternatives have not achieved an optimal solution for designing and manufacturing the MRAM with minimum impact to the design and manufacturing processes.

SUMMARY

A technical advance is achieved by an improved magnetic random access memory according to the present invention. The MRAM has a low per-bit cost, but a relatively high memory density. The manufacturing process for the MRAM can be simple since it eliminates a necessary capacitor and involves only one transistor cell.

The MRAM of the present invention improves upon conventional RAM designs by memorizing a bit logic value (e.g., a "1" or "0") by selectively magnetizing ferromagnetic material layer at or around a small magnetic intersection zone of a word line and a bit line, instead of storing the bit logic value in a capacitor or multiple-transistor circuit, as is done in conventional memory cells. In some embodiments of the present invention, a "write" and "erase" operation can be implemented by directing and reversing directions of a DC current in the bit line and the word line. A "read" operation can be done by providing an input signal and detecting a change to an output current or voltage of the signal.

In one embodiment, a multiple layer design can be implemented on a silicon substrate to implement the MRAM by appropriately arranging insulation layers, metal layers, an integrated circuit layer, and a ferromagnetic material layer. Consequently the small magnetic zone is "sandwiched" between the layers for the bit line and the word line.

The present invention achieves many advantages over traditional RAMs. For example, it shrinks the overall memory cell size to obtain high memory density. Also, due to the simplicity of the design, manufacturing costs can be reduced.

BRIEF DESCRIPTION OF THE DRAWINGS

FIG. 8 is a block diagram for a layout configuration of the integrated circuit of FIG. 1 according to yet another embodiment of the present invention FIG. 9 is a simplified layout diagram of the integrated circuit of FIG. 1 with an angular arrangement of bit lines according to yet another embodiment of the present invention.

DESCRIPTION OF THE EMBODIMENTS

Figure 1:
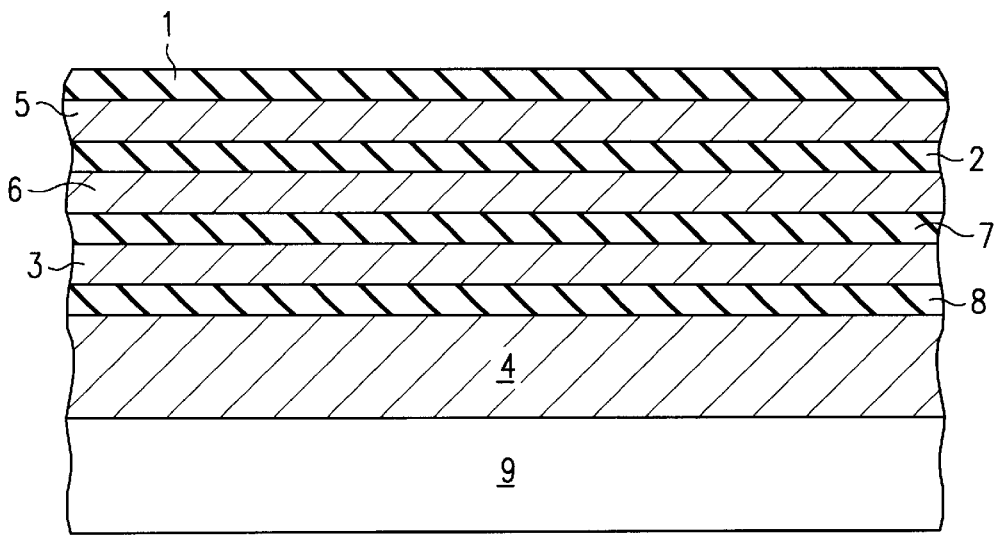
FIG. 1 is a cross-sectional view of a flat-shaped integrated circuit device for implementing one embodiment of the present invention.

FIG. 1 refers, in general, to an integrated circuit that includes a magnetic RAM (hereinafter, the integrated circuit with the magnetic RAM will be referenced as an "MRAM"). The MRAM is capable of memorizing a logic "1" or "0" by magnetizing a small portion of ferromagnetic material at or around an intersection of a specific word line and bit line. It is understood that the present disclosure provides many different embodiments, or examples, for implementing different features. Techniques and requirements that are only specific to certain embodiments should not be imported into other embodiments or devices. Also, specific examples and sequences of process steps and layout configurations are described below to clarify the present disclosure. These are, of course, merely examples and are not intended to limit the invention from that described in the claims.

The cross-sectional view of the MRAM includes isolation layers 1, 2, 7, and 8, metal layers 3 and 5, integrated circuit layer 4, ferromagnetic material layer 6 and substrate 9. The substrate 9 may be of any particular shape, such as flat or spherical, and is suitable for making integrated circuits. The integrated circuit layer 4 is for building logic integrated circuits for controlling memory arrays and one transistor for each memory cell. Metal layer 3 is used for word lines and metal layer 5 is used for bit lines. Ferromagnetic layer 6 is placed between the two metal layers 3 and 5.

The ferromagnetic layer 6 can be produced by different processing methods or combinations of methods. For example, it can be produced by chemical vapor deposition ("CVD"), by plating, or coating with ferromagnetic powder. Isolation layers 2 and 7, which immediately surround ferromagnetic layer 6, may have different properties, or may not exist at all, depending on how the ferromagnetic layer is created.

Figure 2:
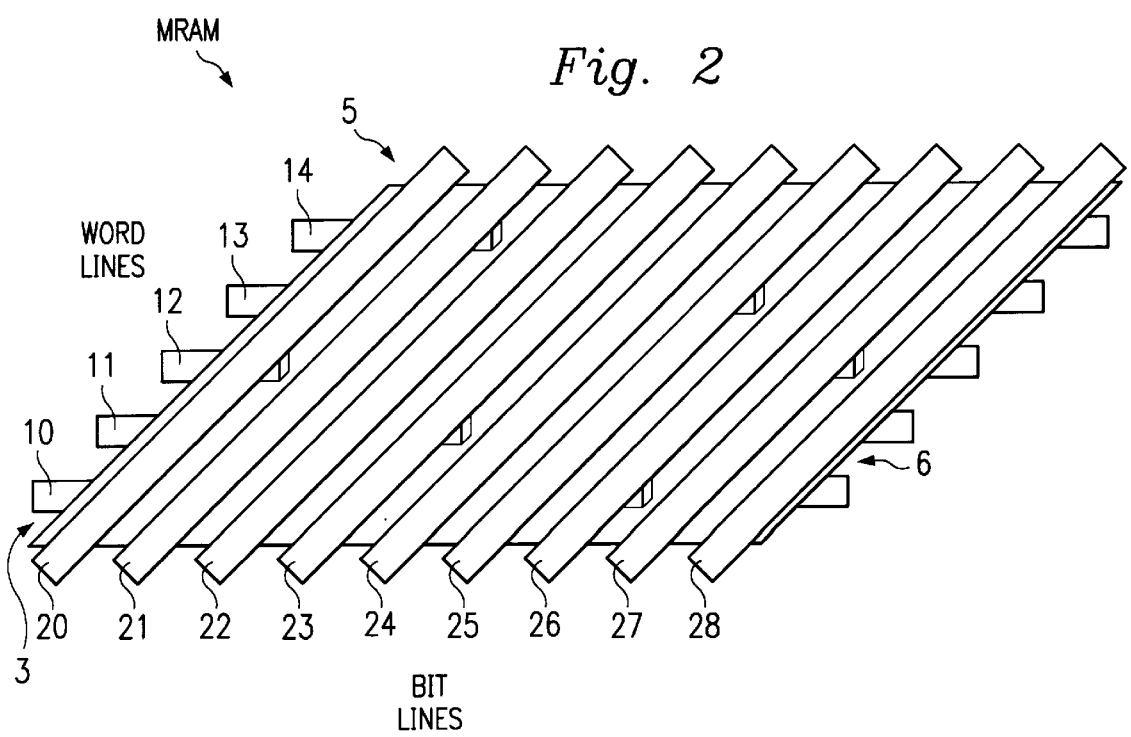
FIG. 2 is a top view of the integrated circuit of FIG. 1.

FIG. 2 further illustrates the metal layer 3 used for wordlines 10–14, ferromagnetic layer 6, and metal layer 5 used for bitlines 20–28. The wordlines 10–14 and bitlines 20–28 intersect at memory cell locations. The memory cell locations include portions of the ferromagnetic layer 6 capable of selectively holding a magnetic charge.

Figure 3:
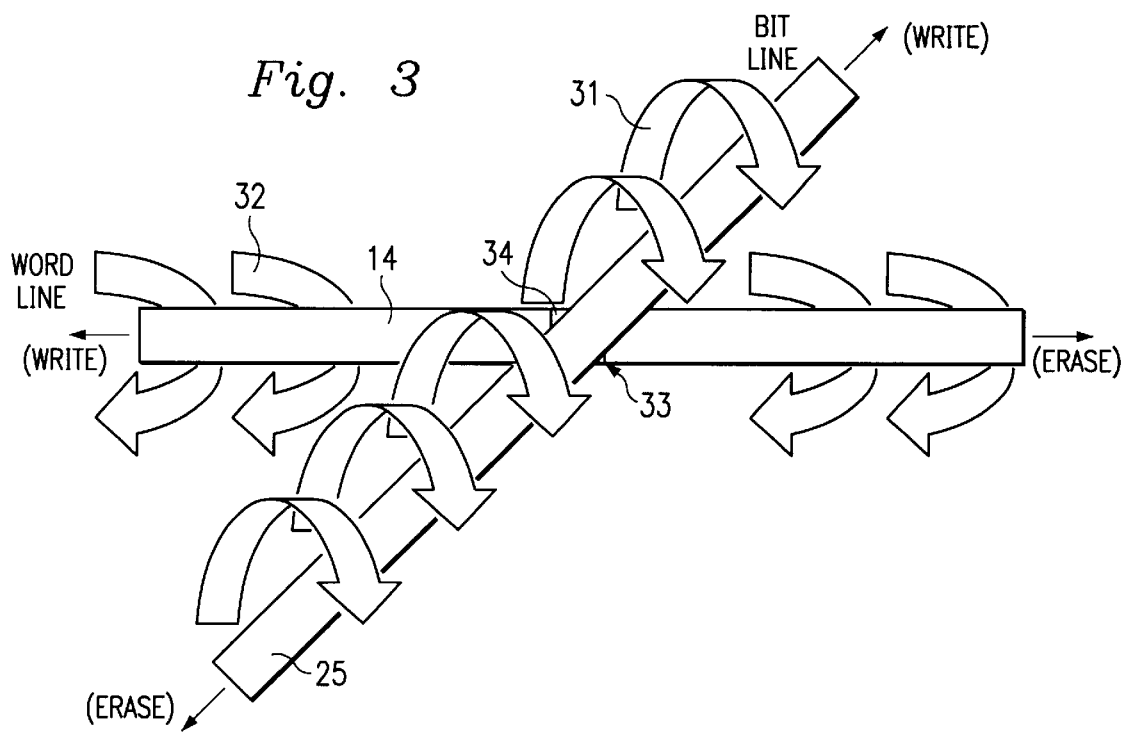
FIG. 3 illustrates write and erase operations in the integrated circuit of FIG. 1.
Figure 4:
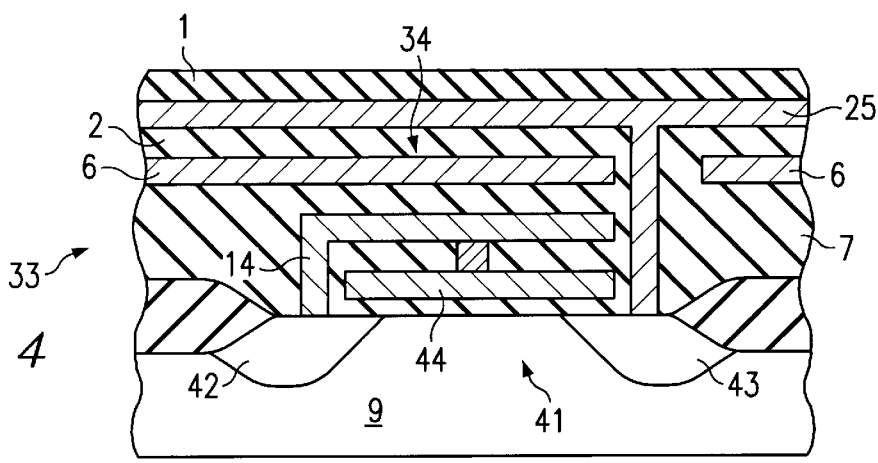
FIG. 4 is a cross-sectional view of a magnetic cell structure for the integrated circuit of FIG. 1.
Figure 5:
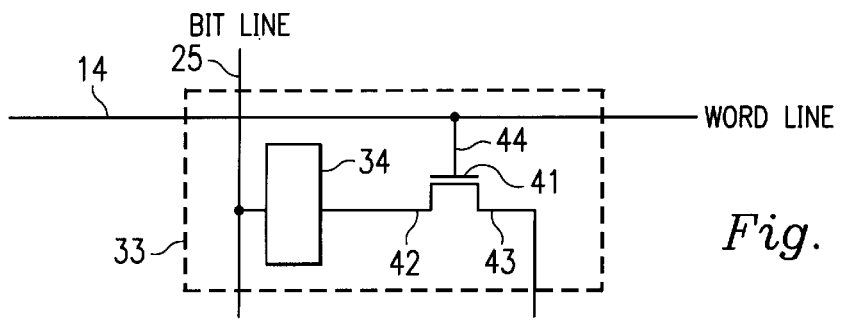
FIG. 5 is a schematic representation of the magnetic cell circuit of FIG. 4.

FIG. 3 illustrates how to perform a write operation and an erase operation on one or more of the memory cells. A write operation is performed by magnetizing a bit line and word line intersection zone or a magnetic zone 34 while an erase operation is performed by de-magnetizing the intersection zone. Although not explicitly illustrated in FIG. 3, a memory cell 33 exists at or near the intersection of the wordline 14 and bitline 25, and is "sandwiched" there between. FIG. 4 and 5 discussed below, illustrate the memory cell 33 in greater details.

The memory cell 33 includes a magnetic zone 34 and a transistor (not shown). The magnetic zone 34 may be magnetized, or energized, by applying DC electric current on the bitline 25 and wordline 14 in a particular manner. In the present example, a DC electric current is applied on bitline 25 from the bottom of the bitline (as it appears in FIG. 3) to the top of the bitline and another DC current is also applied on wordline 14 from the right of the wordline (as it appears in FIG. 3) to the left of the wordline. As a result, magnetic fields 31 and 32 are generated and a small magnetic charge is created at the magnetic zone 34. The DC current levels are strong enough to generate the magnetic fields 31, 32 and to create the magnetic zone 34 at their intersection, but not strong enough to create a magnetic zone anywhere else along the bitline 25 or wordline 14.

The magnetic zone 34 may be de-magnetized by applying DC electric current on the bitline 25 and wordline 14 in an opposite manner. In the present example, a DC electric current is applied on bitline 25 from the top of the bitline (as it appears in FIG. 3) to the bottom of the bitline and another is also applied on wordline 14 from the left of the wordline (as it appears in FIG. 3) to the right of the wordline. As a result, the magnetic fields 31 and 32 are reversed and the charge at the magnetic zone 34 is erased. By doing so, any bit (logic) value memorized by a write operation can be removed by an erase operation.

In one embodiment of the present invention, the bitline 25 and wordline 14 are not perpendicular, but cross at an angle of about 45°. It is understood, however, that different angles can be used for different magnetic effects.

In FIG. 4, the memory cell 33 is shown and defined by the intersection of the bitline 25 and the wordline 14. The memory cell 33 also includes a transistor 41 with a source 42 and a drain 43. An appropriate channel (depending on the doping of the substrate 9) is formed from a gate 44 which is connected to the wordline 14. Also, the drain 43 is connected to the bitline 25. It is understood, however, that different connections and arrangements of the bitlines, wordlines, sources and drains may be used to implement the memory cell 33.

Referring also to FIG. 5, the memory cell 33 is illustrated schematically to show how the magnetic zone 34 works with the transistor 41. Assuming the bit line 25 is connected to the source 42 of the transistor 42 through the magnetic zone 34, when the wordline 14 activates the gate 44 of the transistor 41, the bitline 25 becomes connected to the drain 43, or any circuit that is connected to the drain 43.

Figure 6:
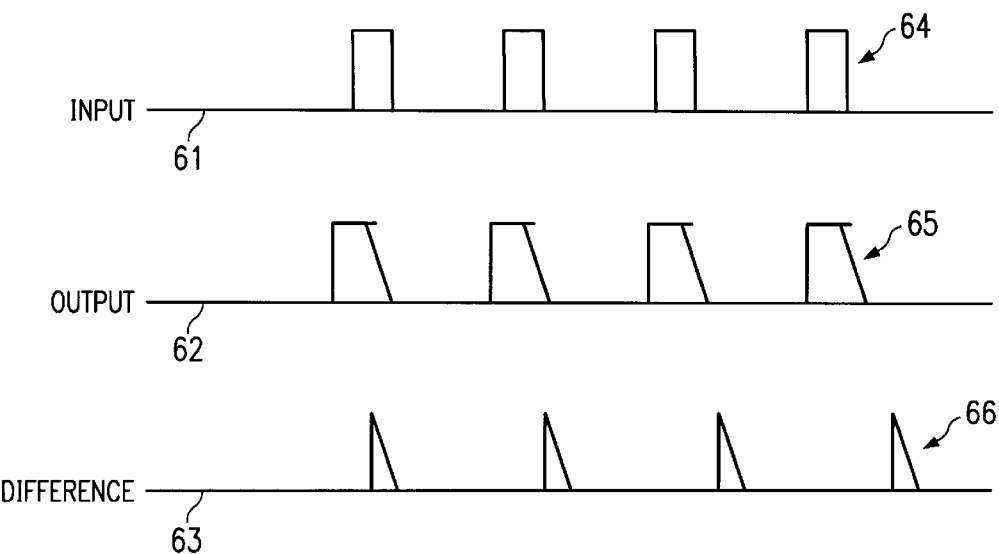
FIG. 6 is a timing diagram for the magnetic cell structure of FIG. 4.

FIG. 6 explains a read operation on the memory cell 33 as it is arranged in FIG. 5. To read the memory cell 33, the wordline 14 and bitline 25 must be selected. When the wordline 14 activates the transistor 41, a pulsed voltage or current input signal 61 is applied to one end of the bitline 25. If the memory cell 33 has a "0" value (the magnetic zone 34 is not energized), then an output signal at the drain 43 of the transistor 41 will appear identical to the input signal 61.

If, however, the memory cell 33 has a "1" value stored (the magnetic zone 34 is energized), then the output signal 62 will appear different from the input signal 61. Consider for example a voltage pulse 64 of the input signal 61. When the voltage on pulse 64 rises sharply on its rising edge (as shown in FIG. 6), the output signal 62 also rises sharply, producing a rising edge of pulse 65. When the voltage drops sharply on the falling edge of pulse 64, then the falling slope of the output signal 62 is not as sharp as the input signal 64. This is because when wordline 14 is selected, the transistor 41 is activated, and the magnetic zone 34 is energized. When the voltage on bitline 25 tries to drop sharply, the voltage drop on the bitline causes an opposite magnetic field than that stored in the magnetic zone 34. As a result, the output pulse 65 results in a delayed falling edge, which distinguishes itself from the input pulse 64.

In order to accurately detect the stored content of the memory cell 33, a difference signal 63 can be determined from the input signal 61 and the output signal 62. If the difference signal 63 is relatively flat, it indicates that the memory cell 33 had a "0" stored therein. If the difference signal 63 indicates a significant difference (e.g., as illustrated by a voltage spike 66), then the memory cell 33 had a "1" stored therein.

Figure 7:
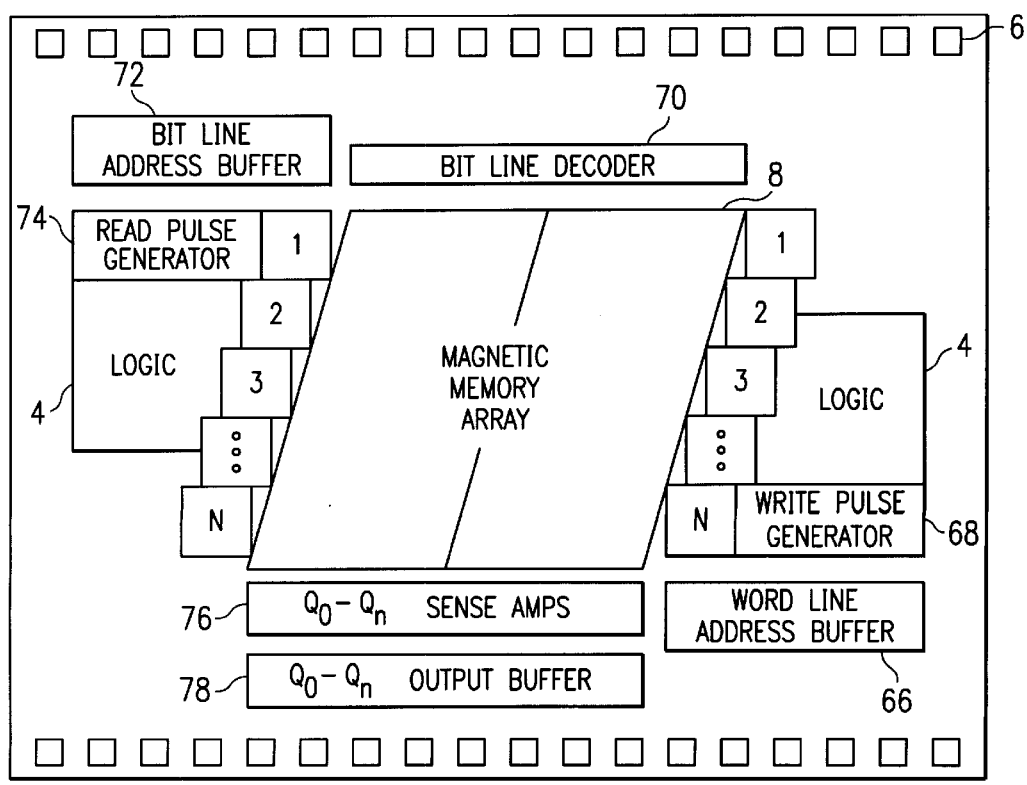
FIG. 7 is a block diagram for a layout configuration of the integrated circuit of FIG. 1 according to another embodiment of the present invention.

FIG. 7 provides a basic block diagram of an integrated circuit that includes a plurality of MRAM cells. These cells form a memory array located in the center of FIG. 7 and the memory array appears as a parallelogram because of the non-perpendicular relationship between the wordlines and bitlines. Also shown in the FIG. 7, there are peripheral control circuits around the memory array. In one embodiment of the present invention, the control circuits include a wordline address buffer 66, a write pulse generator 68, a bitline decoder 70, a bitline address buffer 72, a read pulse generator 74, a sense amplifiers 76, and an output buffer 78. It is understood that control circuits similar to these are used in conventional memory devices and are well understood by those skilled in the art.

FIG. 8 provides another basic block diagram of an integrated circuit that includes a plurality of magnetic RAMs. However, the memory array located in the center of FIG. 8 appears as a square or rectangle. This is because one or both of the wordlines or bitlines are drawn in an angular configuration. Referring to FIG. 9, for example, the wordlines 10–13 may be straight and parallel, but the bitlines 20–22 are angular. As a result, an angle φ between intersecting wordlines and bitlines is in some embodiments less than 90°, and preferably less than 45°.

There has been described and illustrated herein a magnetic random access memory. It should be clearly understood, however, that various modifications, changes and substitutions are intended in the foregoing disclosure and in some instances some features of the invention will be employed without a corresponding use of other features. For example, changing the position of the wordline layer 3 (FIG. 1) and the bitline layer 5 will only require simple modifications to implement the present invention. Furthermore, different connections to the components of transistor 41

(FIG. 4) will also only require simple modifications to implement the present invention. In addition, either a bit logic value "1" or a "0" can indicate a magnetized magnetic zone depending on the configuration of the MRAM. Accordingly, it is appropriate that the appended claims be construed broadly and in a manner consistent with the scope of the invention.

What is claimed is:

1. A magnetic random access memory cell, the cell comprising:
   a word line;
   a bit line crossing the wordline at an acute angle; and
   a magnetic zone of a ferromagnetic material between the word line and the bit line,
   whereby, through electrical controls on the word line and the bit line, a logic value is indicated by the magnetic zone.

2. The memory cell of claim 1 wherein the memory cell is processed on a semiconductor substrate with the word line, the bit line, and the ferromagnetic material on separate material layers.

3. The memory cell of claim 2 wherein the ferromagnetic material layer is situated between the word line layer and the bit line layer.

4. The memory cell of claim 1 whereby the logic value indicated by the magnetic zone can be written to the magnetic zone by applying a first DC electric current on the bit line in a first predetermined direction, and a second DC electric current on the word line in a second predetermined direction.

5. The memory cell of claim 4 wherein the magnetic zone is substantially adjacent to a second magnetic zone, and current levels of both the first and the second DC electric currents are strong enough to induce the magnetic zone, but not the second magnetic zone.

6. The memory cell of claim 4 whereby the logic value indicated by the magnetic zone can be erased by applying a third DC electric current on the bit line in a direction opposite the first predetermined direction, and a fourth DC electric current on the word line in a direction opposite the second predetermined direction.

7. The memory cell of claim 1 further comprising:
   a transistor, wherein the word line connects to a gate area of the transistor and the bit line connects to a drain or a source area of the transistor, and wherein the magnetic zone is situated between the bit line and the transistor.

8. The memory cell of claim 7 further comprising circuitry for:
   activating the word line and the bit line;
   sending an input signal through the bit line into the transistor; and
   detecting the logic value stored in the memory cell by comparing the input signal with an output signal of the transistor,
   wherein the output signal resembles the input signal if the magnetic zone is not magnetized in the cell, and the output signal differs from the input signal with a predetermined pattern if the magnetic zone is magnetized for storing the logic value in the cell.

9. The memory cell of claim 1 wherein the angle is less than 45 degree.

10. A magnetic random access memory device comprising:
    a word line;
    a bit line intersecting, but not contacting, the word line;
    a magnetic zone created by a ferromagnetic material near the intersection between the word line and the bit line; and
    a transistor, wherein the word line connects to a gate area of the transistor, the bit line connects to a drain or a source area of the transistor, and the magnetic zone is situated between the bit line and the transistor,
    whereby a logic value can be memorized in the magnetic zone by providing a first DC current to the word line and a second DC current to the bit line.

11. The memory device of claim 10 wherein the bit line and word line intersect at an acute angle.

12. The memory device of claim 10 wherein the ferromagnetic material layer is situated between the word line layer and the bit line layer.

13. The memory device of claim 10 wherein current levels of both the first and the second DC electric currents are provided in a predetermined direction.

14. The memory device of claim 13 whereby a logic value can be erased by applying a third DC electric current on the bit line in a direction opposite to the first DC electric current, and a fourth DC electric current on the word line in a direction opposite to the second DC electric current.

15. The memory device of claim 10 whereby a logic value can be read from the magnetic zone by performing the steps of:
    activating the word line and the bit line;
    sending a pulsed input voltage signal through the bit line into the transistor; and
    detecting the logic value stored in the memory device by comparing the input voltage signal with an output voltage signal of the transistor,
    wherein the output voltage signal is the same as the input voltage signal if a logic "0" is stored in the device, and the output voltage signal differs from the input voltage signal with a predetermined pattern if a logic "1" is stored in the device.

16. The memory device of claim 10 whereby a logic value can be read from the magnetic zone by performing the steps of:
    activating the word line and the bit line;
    sending a pulsed current input signal through the bit line into the transistor; and
    detecting the logic value stored in the memory device by comparing an output current signal of the transistor,
    wherein the output voltage signal is the same as the input current signal if a logic "0" is stored in the device, and the output current signal differs from the input current signal with a predetermined pattern if a logic "1" is stored in the device.

17. A method for constructing a magnetic random access memory circuit, the method comprising steps of:
    creating a word line extending in a first direction;
    creating a bit line extending in a second direction that is acute to the first direction; and
    creating a magnetic zone of a ferromagnetic material around an intersection between the word line and the bit line,
    whereby a logic value can be selectively memorized in the magnetic zone by a selection of currents provided through the word line and the bit line.

18. The method of claim 17 wherein the magnetic random access memory circuit is processed on a semiconductor substrate with the word line, the bit line, and the ferromagnetic material on separate material layers, and wherein the ferromagnetic material is situated between the word line and the bit line.

19. The method of claim 17 wherein a logic value can be written to the magnetic zone by applying a first DC electric current on the bit line and a second DC electric current on the word line in predetermined directions.

20. The method of claim 19 wherein the current levels of both the first and the second DC electric current are predetermined to induce the magnetic zone and not to induce any nearby magnetic zones.

21. The method of claim 17 wherein a logic value stored in the magnetic zone can be erased by applying a third DC electric current on the bit line in the opposite direction of the first DC electric current, and a fourth DC electric current on the word line in the opposite direction of the second DC electric current.

22. The method of claim 17 further comprising the steps of:
creating a transistor, wherein the word line connects to a gate area of the transistor and the bit line connects to a drain or a source area of the transistor, and wherein the magnetic zone is situated between the bit line and the transistor.

23. The method of claim 22 whereby a logic value can be read from the magnetic zone by performing the steps of:
activating the word line and the bit line;
sending an input signal through the bit line into the transistor; and
reading the logic value stored in the magnetic zone by comparing the input signal with an output signal of the transistor,
wherein the output signal resembles the input signal if the magnetic zone is not magnetized, and the output signal differs from the input signal with a predetermined pattern if the magnetic zone is magnetized.

* * * * *